(12) United States Patent
Ji

(10) Patent No.: US 11,322,382 B2
(45) Date of Patent: May 3, 2022

(54) WAFER SUPPORTING STRUCTURE

(71) Applicant: SK hynix Inc., Icheon-si (KR)

(72) Inventor: So Hyun Ji, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 14 days.

(21) Appl. No.: 16/905,710

(22) Filed: Jun. 18, 2020

(65) Prior Publication Data

US 2021/0111060 A1    Apr. 15, 2021

(30) Foreign Application Priority Data

Oct. 15, 2019 (KR) .......................... 10-2019-0128090

(51) Int. Cl.
*H01L 21/683* (2006.01)

(52) U.S. Cl.
CPC ................................ *H01L 21/6835* (2013.01)

(58) Field of Classification Search
CPC ........ H01L 21/6835; H01L 2221/68304; H01L 2221/68318; H01L 2221/68327
See application file for complete search history.

(56) References Cited

U.S. PATENT DOCUMENTS

| 6,888,253 | B1 | 5/2005 | Rogers et al. |
| 10,049,955 | B2 | 8/2018 | Chang et al. |
| 2014/0065393 | A1* | 3/2014 | Lee ..................... H01L 21/6835 |
| | | | 428/216 |

* cited by examiner

*Primary Examiner* — Carson Gross
(74) *Attorney, Agent, or Firm* — William Park & Associates Ltd.

(57) ABSTRACT

A wafer supporting structure according to an aspect of the present disclosure includes a supporting body, a first strained layer disposed on an upper portion of the supporting body and having a first thermal expansion rate, and a second strained layer disposed on a lower portion of the supporting body and having a second thermal expansion rate different from the first thermal expansion rate. One of the first strained layer and the second strained layer is configured to receive a working wafer thereon.

20 Claims, 15 Drawing Sheets

WAFER SUPPORTING STRUCTURE

CROSS-REFERENCE TO RELATED APPLICATION

The present application claims priority under 35 U.S.C 119(a) to Korean Patent Application No. 10-2019-0128090, filed on Oct. 15, 2019, which is herein incorporated by reference in its entirety.

BACKGROUND

1. Technical Field

The present disclosure relates generally to a wafer supporting structure and, more particularly, to a wafer supporting structure supporting a working wafer, on which a semiconductor process is performed.

2. Related Art

In a recent semiconductor process, a wafer supporting system (WSS) was introduced to form a stacked structure by temporarily bonding a working wafer to a carrier wafer in order to effectively advance the subsequent process on a thin working wafer.

Handling for the thin working wafer can be made easier by using the wafer supporting system. In addition, the result of the semiconductor process can be effectively obtained on the thin working wafer by separating the carrier wafer from the working wafer again after the desired semiconductor process is completed.

SUMMARY

A wafer supporting structure according to an aspect of the present disclosure includes a supporting body, a first strained layer disposed on the supporting body and having a first thermal expansion rate, and a second strained layer disposed under the supporting body and having a second thermal expansion rate different from the first thermal expansion rate. One of the first strained layer and the second strained layer is configured to receive a working wafer thereon.

A wafer supporting structure according to another aspect of the present disclosure includes a supporting body, a first polymer layer disposed on an upper portion of the supporting body, and a second polymer layer disposed on a lower portion of the supporting body. The first polymer layer comprises an epoxy having a first amount of filler and the second polymer layer comprise an epoxy having a second amount of filler different from the first amount of filler. One of the first polymer layer and the second polymer layer is configured to receive a working wafer thereon.

DETAILED DESCRIPTION

Figure 1:
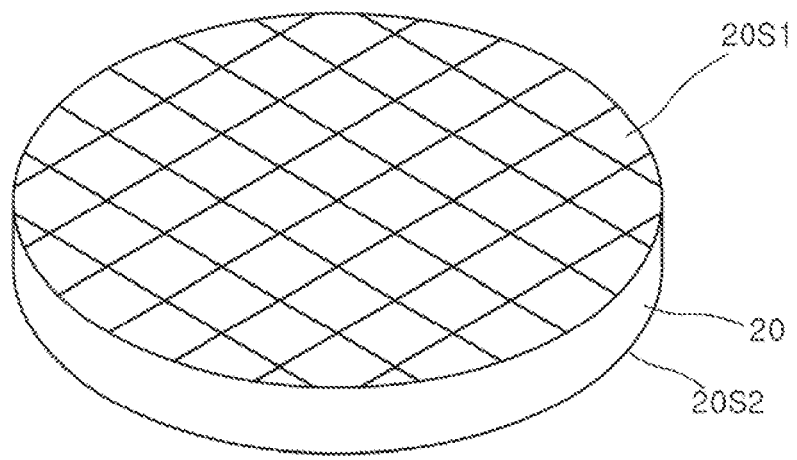
FIGS. 1, 2, 3, and 4 are views schematically illustrating a semiconductor process using a wafer supporting structure according to an embodiment of the present disclosure.
Figure 1:
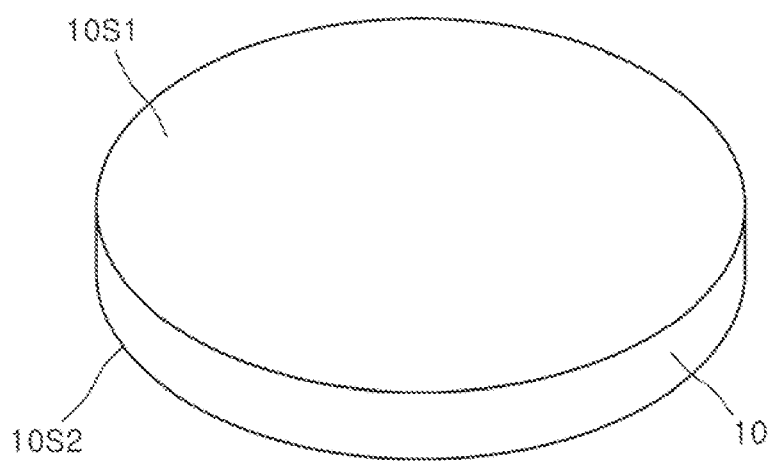

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first," "second," "third" etc. may be used herein to describe various elements, these elements should not be limited by these terms. These terms are only used to distinguish one element from another element, but not used to define only the element itself or to mean a particular sequence. It will also be understood that when an element or layer is referred to as being "on," "over," "below," "under," or "outside" another element or layer, the element or layer may be in direct contact with the other element or layer, or intervening elements or layers may be present.

Same reference numerals refer to same elements throughout the specification. The same or similar reference numerals may be described with reference to other drawings even if they are not mentioned or described in the corresponding drawings. Also, although reference numerals are not indicated, they may be described with reference to other drawings.

In the specification, the working wafer is an object on which a semiconductor process is performed, and may refer to a substrate structure including a substrate made of a semiconductor material and a conductive layer and an insulating layer formed on the substrate.

An embodiment of the present disclosure provides a wafer supporting structure having strained layers having different thermal expansion rates. The wafer supporting structure may receive the working wafer on the wafer supporting structure to form a stack structure. Subsequently, a subsequent semiconductor process may be performed on the working wafer in the form of the stacked structure.

Various embodiments of the present disclosure may provide wafer supporting structures capable of controlling warpage of a working wafer that occurs during a semiconductor thermal process.

FIGS. 1 to 4 are views schematically illustrating a semiconductor process of a working wafer using a wafer supporting structure according to an embodiment of the present disclosure. Referring to FIG. 1, a wafer supporting structure 10 and a working wafer 20 are prepared. In an embodiment, the working wafer 20 may have a thickness of 100 μm or less. The wafer supporting structure 10 and the working wafer 20 may have the same shape on a plane.

The working wafer 20 may have a first surface 20S1 and a second surface 20S2. One of the first surface 20S1 and the second surface 20S2 may be a working surface on which a semiconductor process is performed, and the other may be a bonding surface facing the wafer supporting structure. Similarly, the wafer supporting structure 10 may have a first surface 10S1 and a second surface 10S2. One of the first surface 10S1 and the second surface 10S2 may face the bonding surface of the working wafer 20.

Figure 2:
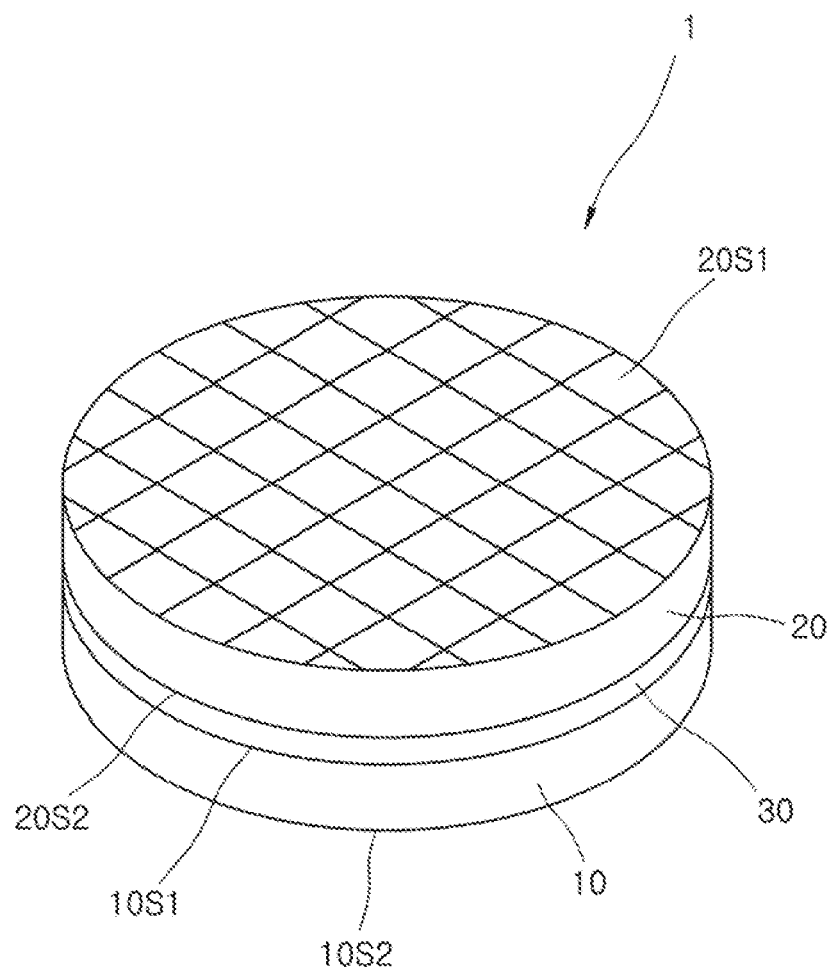

Referring to FIG. 2, the wafer supporting structure 10 and the working wafer 20 are bonded to form a stack structure 1. As described above, the wafer supporting structure 10 and the working wafer 20 have substantially the same shape on a plane, so that the wafer supporting structure 10 and the working wafer 20 can be bonded to overlap each other.

In an embodiment, a bonding structure 30 may be disposed between the wafer supporting structure 10 and the working wafer 20. The bonding structure 30 may include thin films such as an adhesive layer for adhering the wafer supporting structure 10 and the working wafer 20 to each other, a release layer for separating the wafer supporting structure 10 and the working wafer 20 from each other after a predetermined semiconductor process, and a protection layer for protecting the working wafer 20, and the like. The word "predetermined" as used herein with respect to a parameter, such as a predetermined semiconductor process, direction, or thickness, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

For example, any one of the first surface 10S1 and the second surface 10S2 of the wafer support structure 10 and the bonding surface of the working wafer 20 may be arranged to face each other, and then the wafer support structure 10 and the working wafer 20 may be bonded using the bonding structure 30. As an example, as illustrated in FIG. 2, the bonding structure 30 may be disposed between the first surface 10S1 of the wafer supporting structure 10 and the second surface 20S2 of the working wafer 20 to form the stack structure 1.

Thereafter, a semiconductor process may be performed with respect to the working surface of the working wafer 20. The semiconductor process may include, for example, a thin film forming process through deposition or plating, a photoresist pattern layer forming process, a thin film patterning process through etching or polishing, and the like.

Figure 3:
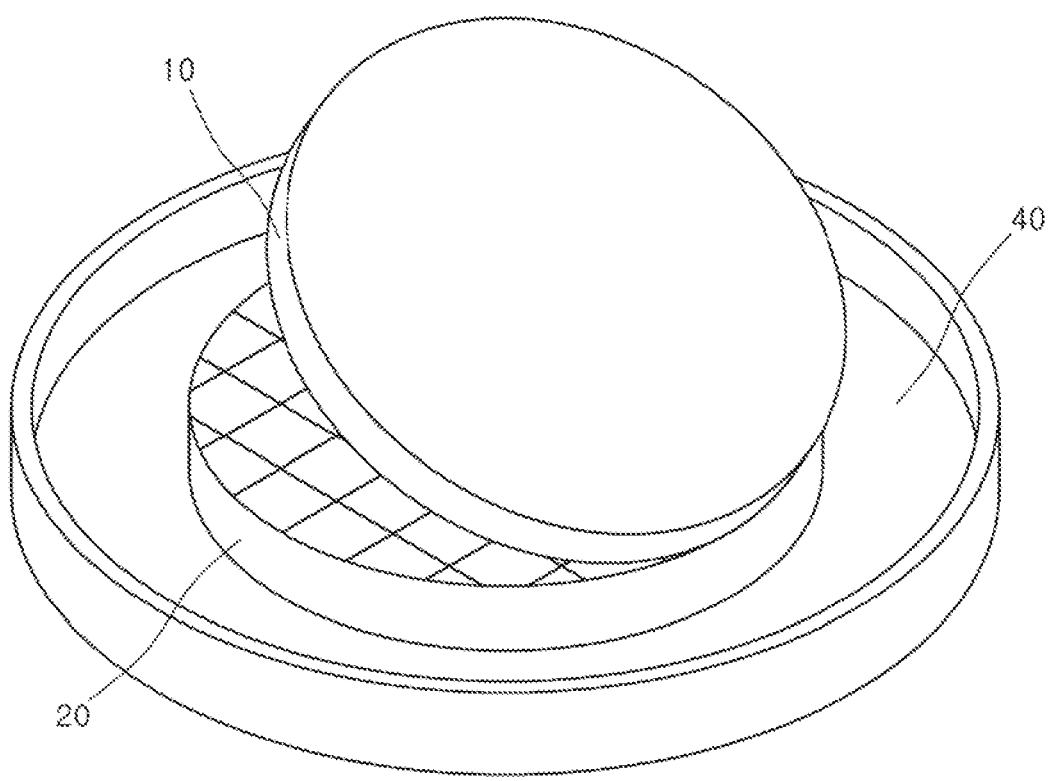

Referring to FIG. 3, after the stack structure 1 to which the semiconductor process has been completed is disposed on a worktable 40, the working wafer 20 and the wafer supporting structure 10 may be separated from each other. In an embodiment, the working wafer 20 may be separated from the wafer support structure 10 by physically or chemically removing at least a portion of the bonding structure 30. As an example, by removing the release layer of the bonding structure 30, the working wafer 20 may be separated from the wafer support structure 10.

Figure 4:
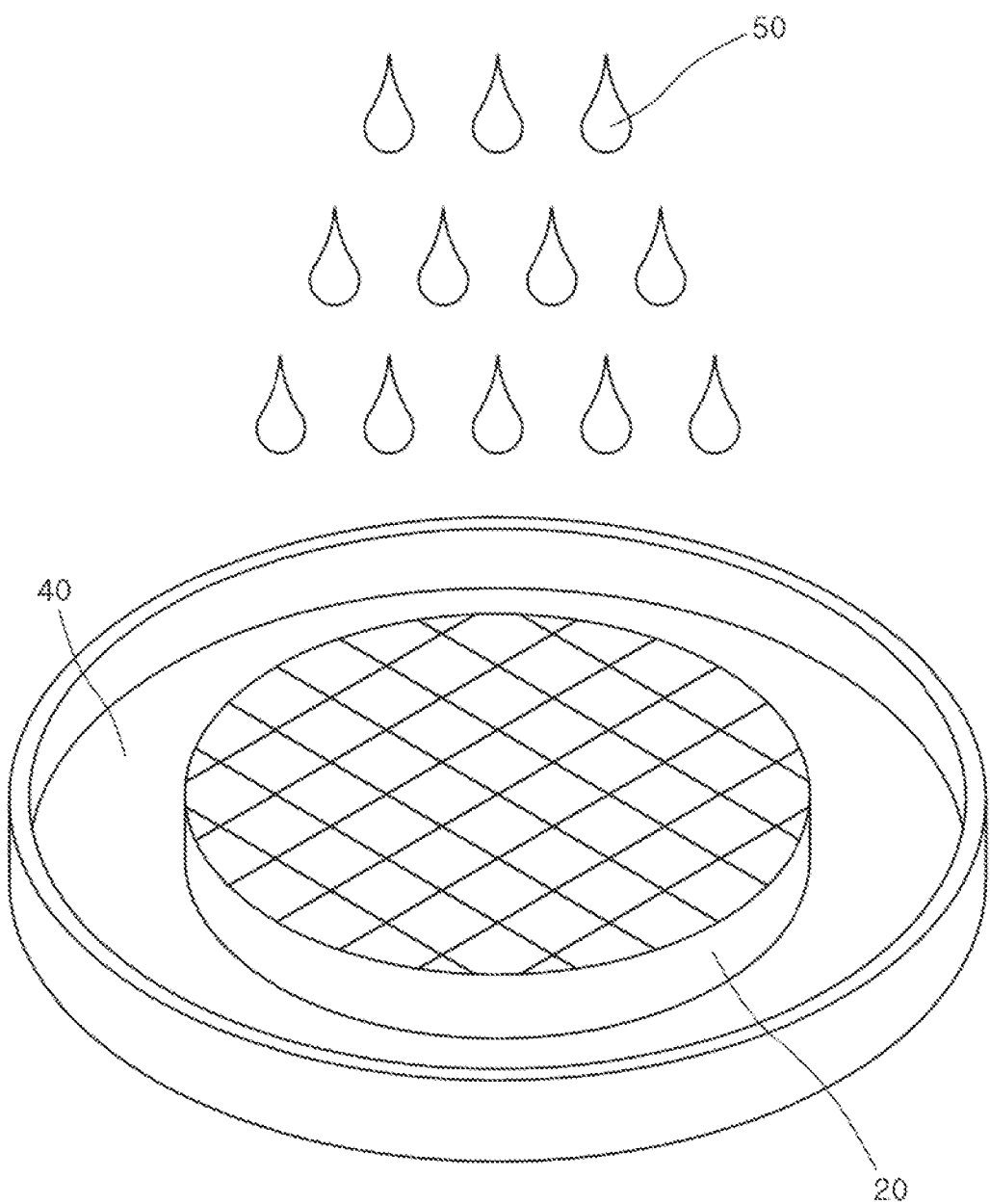

Referring to FIG. 4, the separated working wafer 20 may be cleaned. In an embodiment, the working wafer 20 may be wet-cleaned by providing cleaning liquid 50 to the working wafer 20 on the worktable 40.

In the above-described method, the wafer supporting structure 10 can be used to effectively handle the thin working wafer 20 and to effectively perform the semiconductor process to the working wafer 20. Meanwhile, as a plurality of different semiconductor processes are sequentially performed on the working wafer 20, a plurality of material layers having different thermal expansion rates may be formed on the working wafer 20. Accordingly, when a thermal process is performed to the working wafer 20 including the plurality of material layers, deformation such as warpage may occur in the working wafer 20 depending on the type of the thermal process and the magnitude of the thermal expansion of the plurality of material layers. As will be described later, embodiments of the present disclosure provide wafer supporting structures 10a, 10b and 10c having new structures capable of controlling warpage of the working wafer 20, occurring during a semiconductor process involving a thermal process.

Figure 5A:
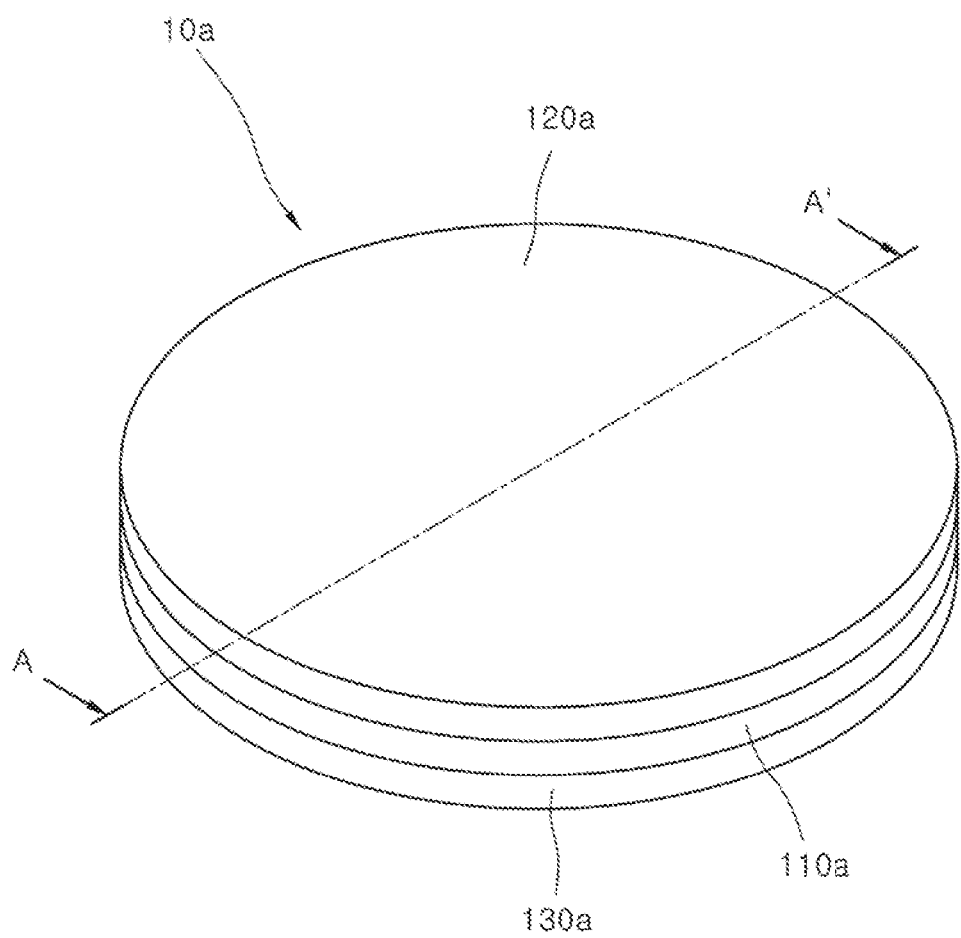
FIG. 5A is a perspective view schematically illustrating a wafer supporting structure according to an embodiment of the present disclosure.
Figure 5B:
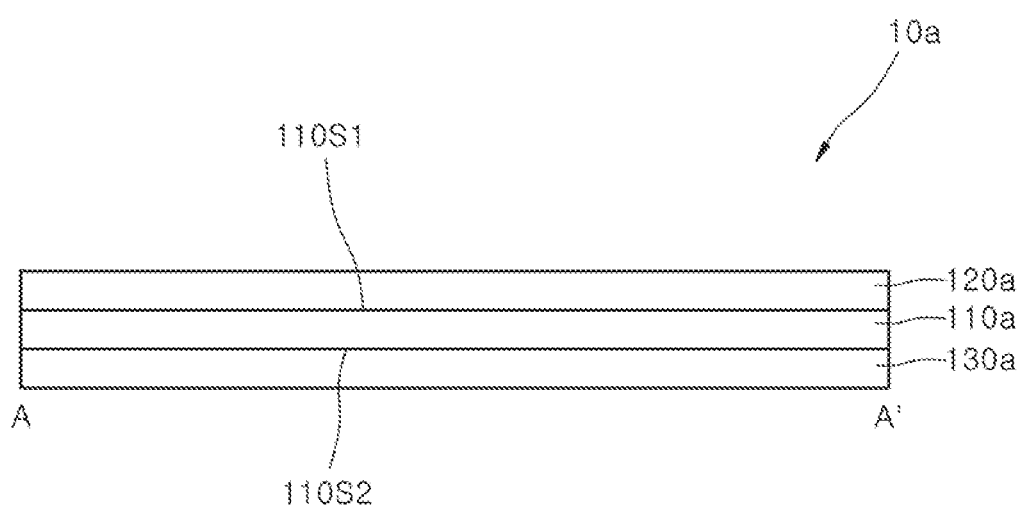
FIG. 5B is a cross-sectional view taken along the line A-A' of the wafer supporting structure of FIG. 5A.
Figure 5C:
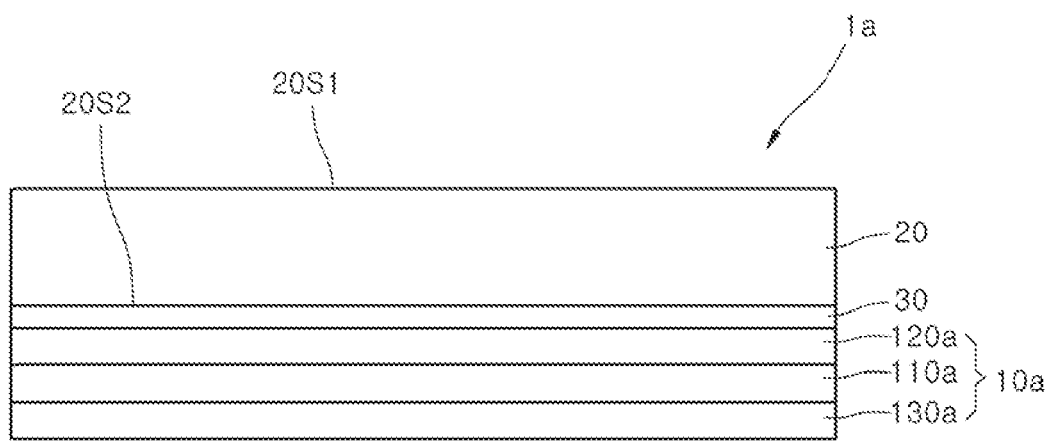
FIG. 5C is a cross-sectional view of a stack structure in which a wafer supporting structure and a working wafer are coupled according to an embodiment of the present disclosure.

FIG. 5A is a perspective view schematically illustrating a wafer supporting structure according to an embodiment of the present disclosure. FIG. 5B is a cross-sectional view taken along the line A-A' of the wafer supporting structure of FIG. 5A. FIG. 5C is a cross-sectional view of a stack structure in which a wafer supporting structure and a working wafer are combined according to an embodiment of the present disclosure.

Referring to FIGS. 5A and 5B, a wafer supporting structure 10a includes a supporting body 110a, a first strained layer 120a disposed on an upper portion of the supporting body 110a, and a second strained layer 130a disposed on a lower portion of the supporting body 110a.

The supporting body 110a may include a material having a stiffness greater than those of the first strained layer 120a and the second strained layer 130a. The supporting body 110a may correspond to a body portion that supports the wafer supporting structure 10a. As an example, the supporting body 110a may be a plate-shaped structure having a predetermined thickness. As an example, the supporting body 110a may include silicon or silicon oxide.

The first strained layer 120a and the second strained layer 130a may include a polymer material. In an embodiment, the first strained layer 120a and the second strained layer 130a may have different thermal expansion rates. The first strained layer 120a may include an epoxy in which a silica filler of a first amount is dispersed. The first strained layer 120a may be a first polymer layer having a first thermal expansion rate. The second strained layer 130a may include an epoxy in which a silica filler having a second amount different from the first amount is dispersed. The second strained layer 130a may be a second polymer layer having a second thermal expansion rate. As the amounts of the silica fillers in the epoxy increases, the thermal expansion rates of the first strained layer 120a and the second strained layer 130a may decrease, respectively.

Referring to FIGS. 5A and 5B, the first strained layer 120a may be disposed to be bonded to an upper surface 110S1 of the supporting body 110a and the second strained layer 130a may be disposed to be bonded to a lower surface 110S2 of the supporting body 110a. In an embodiment, the supporting body 110a, the first strained layer 120a and the second strained layer 130a may have substantially the same thickness. The wafer supporting structure 10a including the supporting body 110a, the first strained layer 120a and the second strained layer 130a may have a thickness of 750~780 µm as a whole. In an embodiment, one of the first strained layer 120a and the second strained layer 130a is configured to receive a working wafer thereon, as described hereinafter.

Referring to FIG. 5C, a stack structure in which a bonding structure 30 and a working wafer 20 are sequentially stacked may be provided on the wafer supporting structure 10a. As illustrated, a first surface 20S1 of the working wafer 20 may be provided as the working surface on which a semiconductor process is performed, and a second surface 20S2 may be provided as the bonding surface. As described with FIG. 2, as the working wafer 20 includes material layers having different thermal expansion rates, the thermal expansion rate of the working wafer 20 on the bonding surface 20S2 and the thermal expansion rate of the working wafer 20 on the working surface 20S1 may be different from each other.

In an embodiment, when the thermal expansion rate of the working wafer 20 on the bonding surface 20S2 is greater than the thermal expansion rate of the working wafer 20 on the working surface 20S1, the thermal expansion rate of the first strained layer 120a of the wafer supporting structure 10a disposed to face the bonding surface 20S2 may be greater than the thermal expansion rate of the second strained layer 130a. In other words, any one of the first strained layer 120a and the second strained layer 130a of the wafer supporting structure 10a, having a high thermal expansion rate may be selected and disposed to face the bonding surface 20S2. As described above, when the thermal expansion rate of the working wafer 20 on the bonding surface 20S2 is greater than the thermal expansion rate of the working wafer 20 on the working surface 20S1, a force generating a warpage in the form of 'U' may be applied to the stack structure 1a from the working wafer 20. On the other hand, when the thermal expansion rate of the first strained layer 120a of the wafer support structure 10a bonded to the working wafer 20 is configured to be greater than that of the second strained layer 130a, a force generating a warpage in the form of '∩' opposite to the form of 'U' may be applied to the stack structure 1a from the wafer supporting structure 10a. As a result, during a semiconductor thermal process is performed to the stack structure 1a, the force generating the warpage in the form of 'U' generated in the working wafer 20 may be canceled out. As a result, the warpage of the stack structure 1a can be suppressed during the semiconductor process.

In another embodiment, when the thermal expansion rate of the working wafer 20 on the bonding surface 20S2 is less than the thermal expansion rate of the working wafer 20 on the working surface 20S1, the thermal expansion rate of the first strained layer 120a of the wafer supporting structure 10a, disposed to face the bonding surface 20S2 may be less than the thermal expansion rate of the second strained layer 130a. In other words, any one of the first strained layer 120a and the second strained layer 130a of the wafer supporting structure 10a, having a low thermal expansion rate may be selected and disposed to face the bonding surface 20S2. As described above, when the thermal expansion rate of the working wafer 20 on the bonding surface 20S2 is less than the thermal expansion rate of the working wafer 20 on the working surface 20S1, a force generating a warpage in the form of '∩' may be applied to the stack structure 1a from the working wafer 20. On the other hand, when the thermal expansion rate of the first strained layer 120a of the wafer support structure 10a bonded to the working wafer 20 is configured to be less than that of the second strained layer 130a, a force generating a warpage in the form of 'U' opposite to the form of '∩' may be applied to the stack structure 1a from the wafer supporting structure 10a. As a result, during a semiconductor thermal process is performed to the stack structure 1a, the force generating the warpage in the form of '∩' generated in the working wafer 20 may be canceled out. As a result, the warpage of the stack structure 1a can be suppressed during the semiconductor process.

Figure 6A:
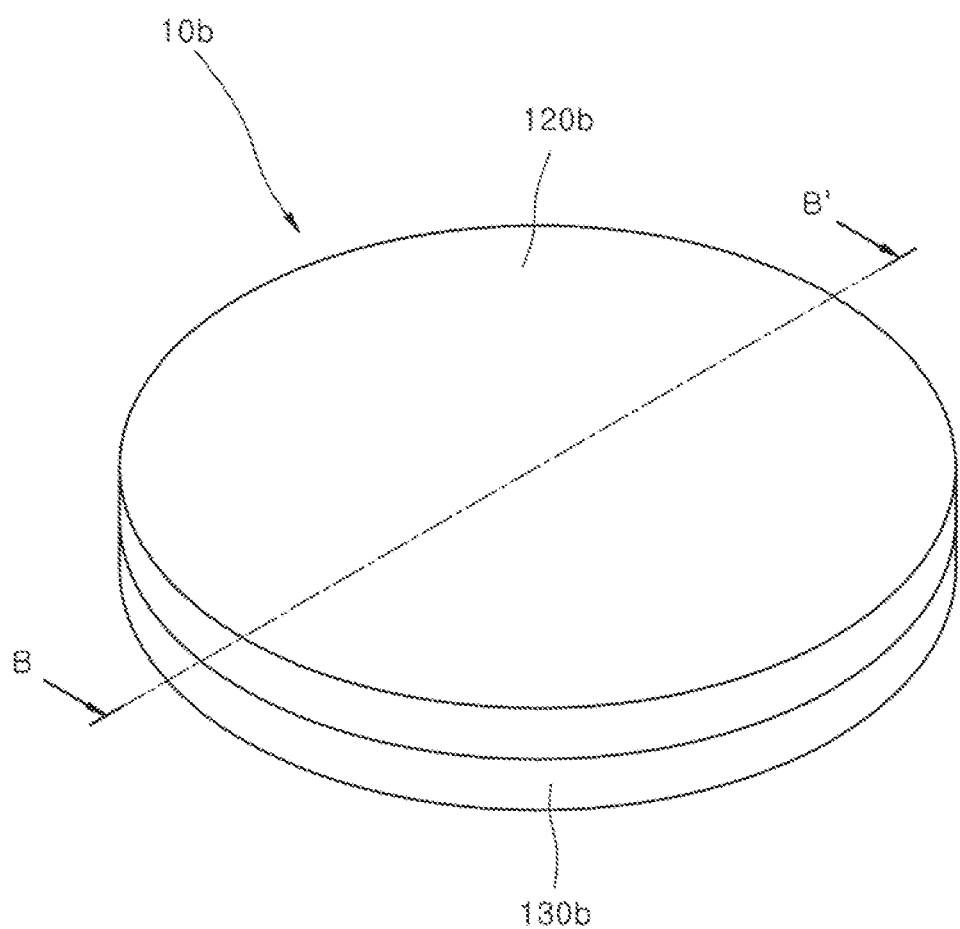
FIG. 6A is a perspective view schematically illustrating a wafer supporting structure according to another embodiment of the present disclosure.
Figure 6B:
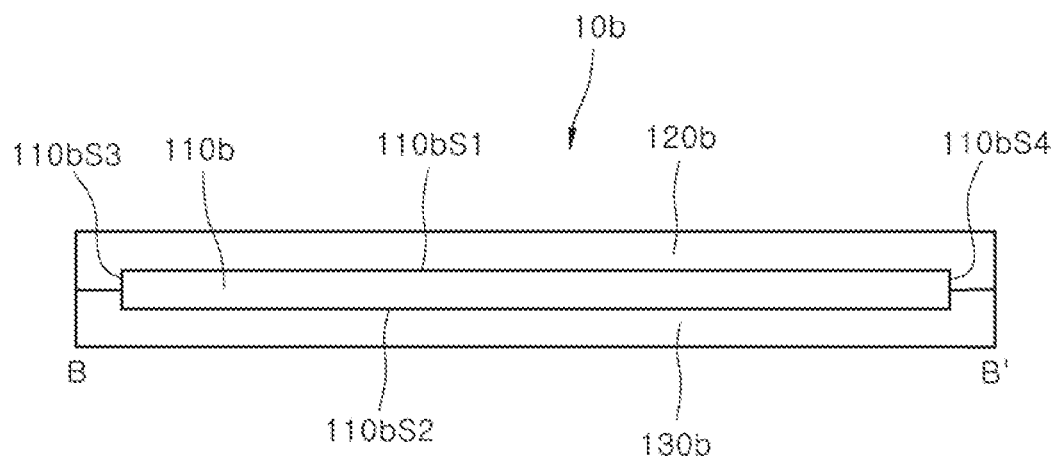
FIG. 6B is a cross-sectional view taken along the line B-B' of the wafer supporting structure of FIG. 6A.
Figure 6C:
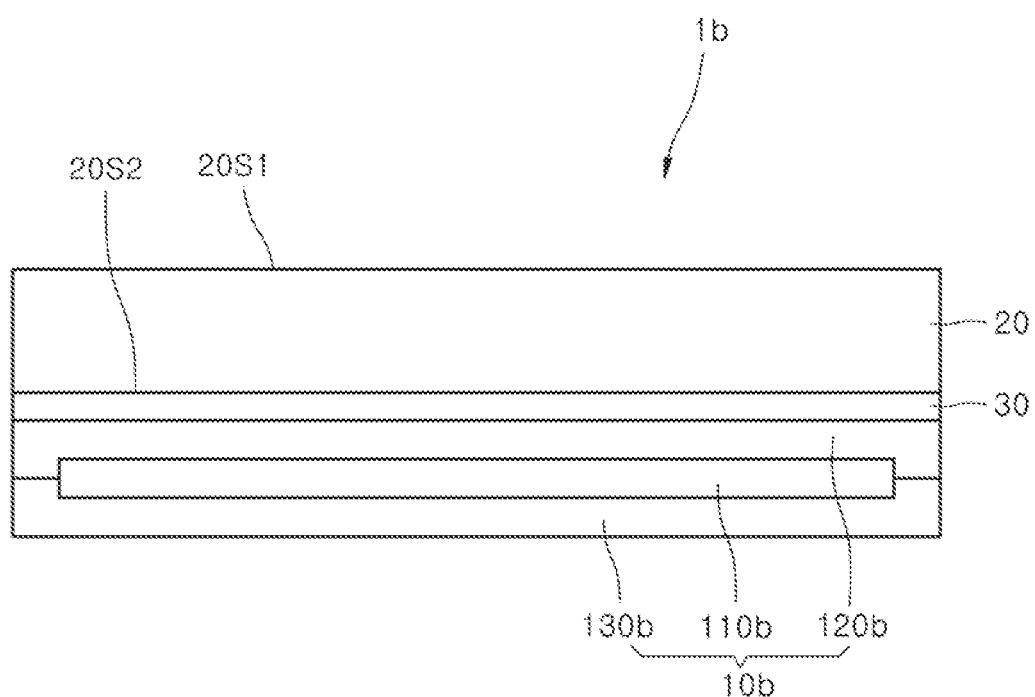
FIG. 6C is a cross-sectional view of a stack structure in which a wafer supporting structure and a working wafer are coupled according to another embodiment of the present disclosure.

FIG. 6A is a perspective view schematically illustrating a wafer supporting structure according to another embodiment of the present disclosure. FIG. 6B is a cross-sectional view taken along the line B-B' of the wafer supporting structure of FIG. 6A. FIG. 6C is a cross-sectional view of a stack structure in which a wafer supporting structure and a working wafer are coupled according to another embodiment of the present disclosure.

Referring to FIGS. 6A and 6B, a wafer supporting structure 10b includes a supporting body 110b, a first strained layer 120b disposed on an upper portion of the supporting body 110b, a second strained layer 130b disposed on a lower portion of the supporting body 110b. Further, the first strained layer 120b and the second strained layer 130b cover side portions of the supporting body 110b. The wafer supporting structure 10b may differ in the arrangement of the first and second strained layers 120b and 130b compared to the wafer supporting structure 10a of FIGS. 5A and 5B. The configuration of the first and second strained layers 120b and 130b except for the arrangement is substantially the same as the configuration of the first and second strained layers 120a and 130a described above with reference to FIGS. 5A and 5B. The configuration of the supporting body 110b is substantially the same as the configuration of the supporting body 110a described above with reference to FIGS. 5A and 5B.

Referring to FIGS. 6A and 6B, the first strained layer 120b and the second strained layer 130b may be disposed to bury the supporting body 110b. In an embodiment, the first strained layer 120b may be disposed to cover an upper surface 110bS1 of the supporting body 110b and to cover a portion of first and second side surfaces 110bS3 and 110bS4 of the supporting body 110b. The second strained layer 130b may be disposed to cover a lower surface 110bS2 of the supporting body 110b and to cover the remaining portions of the first and second side surfaces 110bS3 and 110bS4 of the supporting body 110b. In another embodiment not illustrated, the first strained layer 120b may be disposed to cover the upper surface 110bS1 of the supporting body 110b and to cover the entirety of the first and second side surfaces 110bS3 and 110bS4. The second strained layer 130b may be disposed to cover the lower surface 110bS2 of the supporting body 110b. In another embodiment not illustrated, the first strained layer 120b may be disposed to cover the upper surface 110bS1 of the supporting body 110b, and the second strained layer 130b may be disposed to cover the lower surface 110bS2 and the entirety of the first and second side surfaces 110bS3 and 110bS4 of the supporting body 110b.

Referring to FIG. 6C, a stack structure 1b in which a bonding structure 30 and a working wafer 20 are sequentially stacked may be provided on the wafer supporting structure 10b. As illustrated, a first surface 20S1 of the working wafer 20 may be provided as a working surface on which a semiconductor process is performed, and a second surface 20S2 may be provided as a bonding surface. As described above, the thermal expansion rate of the working wafer 20 on the bonding surface 20S2 and the thermal expansion rate of the working wafer 20 on the working surface 20S1 may be different from each other.

In an embodiment, when the thermal expansion rate of the working wafer 20 on the bonding surface 20S2 is greater than the thermal expansion rate of the working wafer 20 on the working surface 20S1, the thermal expansion rate of the first strained layer 120b disposed to face the bonding surface 20S2 may be greater than the thermal expansion rate of the second strained layer 130b. In another embodiment, when the thermal expansion rate of the working wafer 20 on the bonding surface 20S2 is less than the thermal expansion rate of the working wafer 20 on the working surface 20S1, the thermal expansion rate of the first strained layer 120b disposed to face the bonding surface 20S2 may be less than the thermal expansion rate of the second strained layer 130b. Accordingly, the first and second strained layers 120b and 130b have substantially the same function as the first and second strained layers 120a and 130a described above with reference to FIG. 5C during the semiconductor thermal process, thereby suppressing the warpage of the stack structure 1b.

Figure 7A:
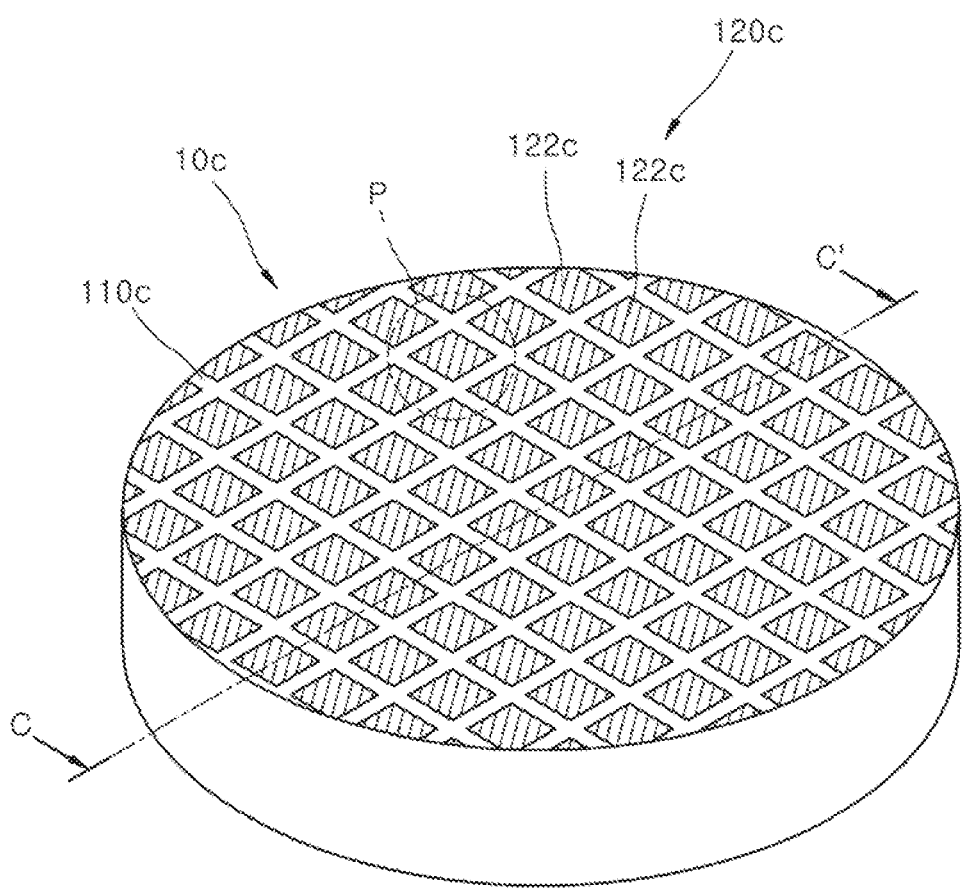
FIG. 7A is a perspective view schematically illustrating a wafer supporting structure according to yet another embodiment of the present disclosure.
Figure 7B:
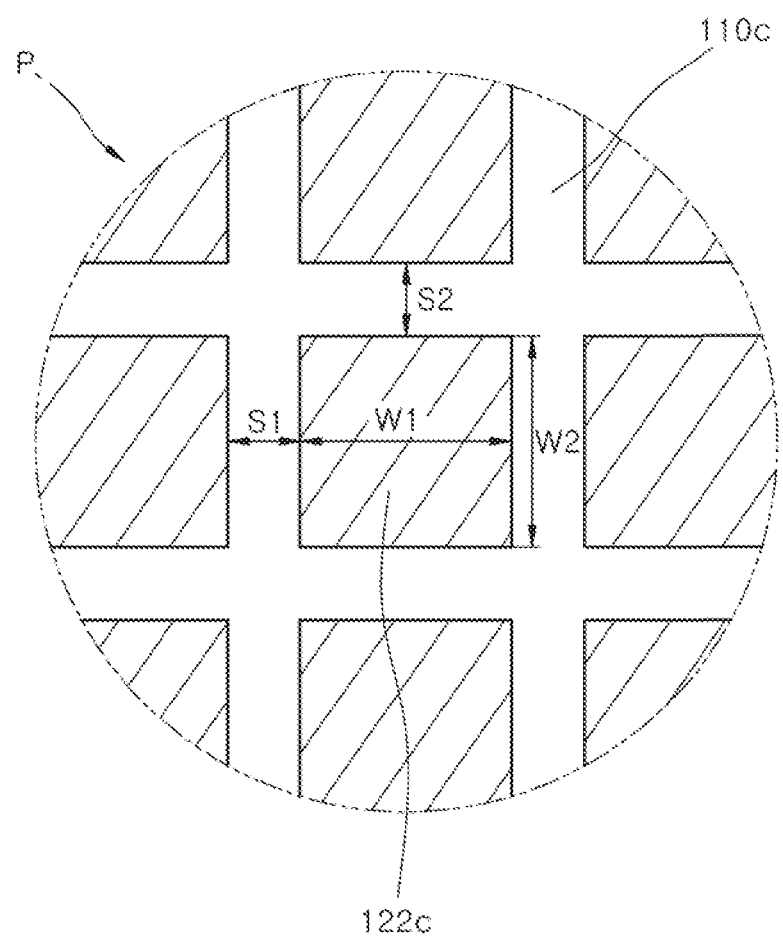
FIG. 7B is an enlarged plan view the region 'P' of the wafer supporting structure of FIG. 7A.
Figure 7C:
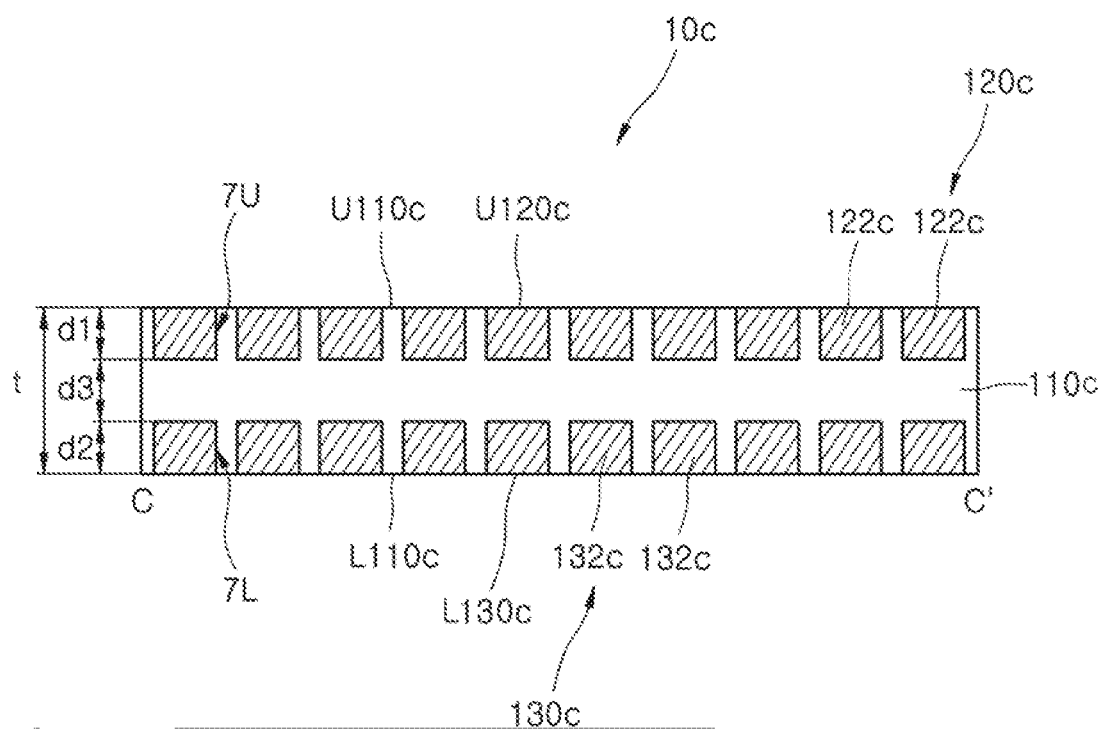
FIG. 7C is a cross-sectional view taken along the line C-C' of the wafer supporting structure of FIG. 7A.
Figure 7D:
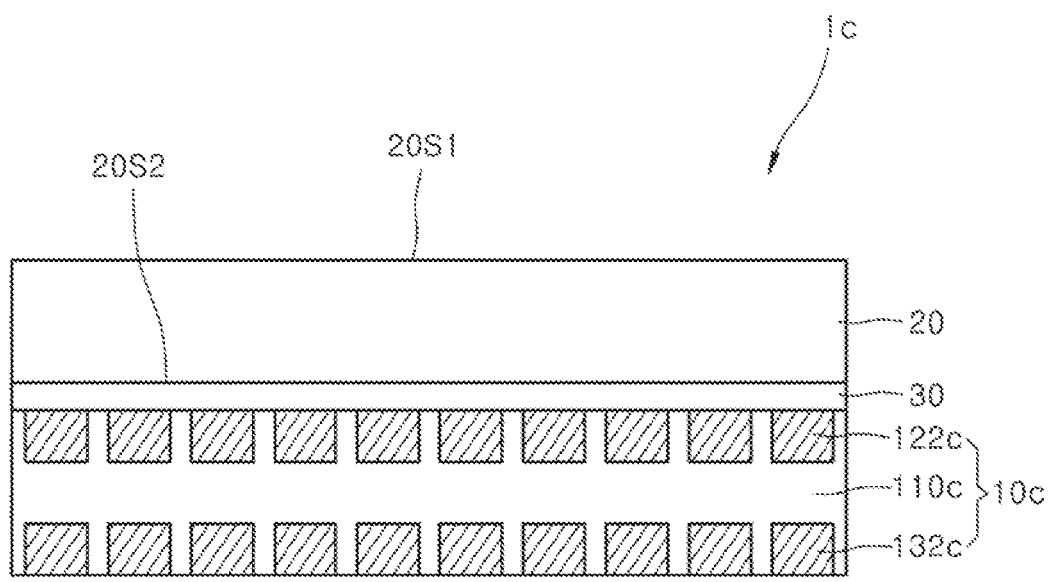
FIG. 7D is a cross-sectional view of a stack structure in which a wafer supporting structure and a working wafer are coupled according to yet another embodiment of the present disclosure.

FIG. 7A is a perspective view schematically illustrating a wafer supporting structure according to yet another embodiment of the present disclosure. FIG. 7B is an enlarged plan view of a region 'P' of the wafer supporting structure of FIG. 7A. FIG. 7C is a cross-sectional view taken along the line C-C' of the wafer supporting structure of FIG. 7A. FIG. 7D is a cross-sectional view of a stack structure in which a wafer supporting structure and a working wafer are coupled according to yet another embodiment of the present disclosure.

Referring to FIGS. 7A to 7C, a wafer supporting structure 10c may include a supporting body 110c, a first trench 7U formed in an upper portion of the supporting body 110c, and a second trench 7L formed in a lower portion of the supporting body 110c. In addition, the wafer supporting structure 10c may include a first strained layer 120c filling the first trench 7U, and a second strained layer 130c filling the second trench 7L. As a result, a wafer supporting structure 10c may include the first strained layer 120c on the upper portion of the supporting body 110c and the second strained layer 130c on the lower portion of the supporting body 110c. An upper surface U120c of the first strained layer 120c may be disposed on the same level as an upper surface U110c of the supporting body 110c. A lower surface L130c of the second strained layer 130c may be disposed on the same level as a lower surface L110c of the supporting body 110c. Accordingly, the supporting body 110c and the first strained layer 120c may be exposed on an upper surface of the wafer supporting structure 10c. In addition, the supporting body 110c and the second strained layer 130c may be exposed on a lower surface of the wafer supporting structure 10c. That is, the first and second strained layers 120c and 130c may be disposed in forms of patterns on the upper surface and the lower surface of the wafer supporting structure 10c. Except for the form of the pattern, material properties including thermal expansion rates of the first and second strained layers 120c and 130c are substantially the same as material properties of the first and second strained layers 120a and 130a described above with reference to FIGS. 5A and 5B. The material property of the supporting body 110c is substantially the same as the material property of the supporting body 110a described above with reference to FIGS. 5A and 5B.

Referring to FIGS. 7A and 7B, the first strained layer 120c may include a plurality of sub pattern layers 122c arranged in a predetermined direction while being spaced apart from each other on the supporting body 110c. Likewise, referring to FIG. 7C, the second strained layer 130c may include a plurality of sub pattern layers 132c arranged in a predetermined direction while being spaced apart from each other under the supporting body 110c. In an embodiment, the first strained layer 120C may have a first thermal expansion rate different from a second thermal expansion rate of the second strained layer 130C. In an embodiment, each of the plurality of sub pattern layers 122c of the first strained layer 120c may have a rectangular shape having a first width W1 and a second width W2. In addition, one sub pattern layer 122c may be disposed to be spaced apart from other sub pattern layers 122c at a first interval S1 in a first direction and a second interval S2 in a second direction perpendicular to the first direction. The configurations of the sub pattern layers 132c of the second strained layer 130c may be substantially the same as the configurations of the sub pattern layers 122c of the first strained layer 120c.

Referring to FIG. 7C, when the supporting body 110c has a predetermined thickness t, the first trench 7U may be formed to have a first distance d1 inward from the upper surface of the supporting body 110c. Accordingly, the sub pattern layers 122c may have a thickness corresponding to the first distance d1 inward from the upper surface of the supporting body 110c. In addition, the second trench 7L may be formed to have a second distance d2 inward from the lower surface of the supporting body 110c. Accordingly, the sub pattern layers 132c may have a thickness corresponding to the second distance d2 inward from the lower surface of the supporting body 110c. The supporting body 110c may be spaced apart by a third distance d3 between the bottom surface of the first trench 7U and the bottom surface of the second trench 7L. In an embodiment, the supporting body 110c may have to a thickness t of 750~780 μm as a whole. In an embodiment, the first and the second distances d1 and d2 may have substantially the same magnitude. That is, the thickness of the sub pattern layers 122c may be substantially the same as the thickness of the sub pattern layers 132c. In an embodiment, the first to third distances d1, d2 and d3 may have substantially the same magnitude.

Referring to FIG. 7D, a stack structure 1c in which a bonding structure 30 and a working wafer 20 are sequentially stacked may be provided on the wafer supporting structure 10c. As illustrated, a first surface 20S1 of the working wafer 20 may be provided as a working surface on which a semiconductor process is performed, and a second surface 20S2 may be provided as a bonding surface. As described above, the thermal expansion rate of the working wafer 20 on the bonding surface 20S2 and the thermal expansion rate of the working wafer 20 on the working surface 20S1 may be different.

In an embodiment, when the thermal expansion rate of the working wafer 20 on the bonding surface 20S2 is greater than the thermal expansion rate of the working wafer 20 on the working surface 20S1, the thermal expansion rate of each of the plurality of sub pattern layers 122c disposed to face the bonding surface 20S2 may be greater than the thermal expansion rate of each of the plurality of sub pattern layers 132c. In another embodiment, when the thermal expansion rate of the working wafer 20 on the bonding surface 20S2 is less than the thermal expansion rate of the working wafer 20 on the working surface 20S1, the thermal expansion rate of each of the plurality of sub pattern layers 122c disposed to face the bonding surface 20S2 may be less than the thermal expansion rate of each of the plurality of sub pattern layers 132c. Accordingly, the first and second strained layers 120c and 130c having the plurality of sub pattern layers 122c and 132c, respectively may have a substantially the same function as the first and second strained layers 120a and 130a described above with reference to FIG. 5C during the semiconductor thermal process, thereby suppressing the warpage of the stack structure 1c.

Hereinafter, an example for describing a technical idea of the present disclosure is provided. However, such an example is merely expressing the technical idea, and the scope of the present disclosure is not limited to the above embodiments.

EXAMPLES

A stack structure was formed by bonding a working wafer to a wafer supporting structure of substantially the same shape as the embodiments described above with reference to FIGS. 7A to 7C. Then, the degree of warpage occurrence caused by the thermal process for the stack structure was simulated.

A supporting body 110c of the wafer supporting structure was made of silicon material. The supporting body 110c was configured to have a thickness of 775 micrometers (μm), the first distance d1 of the first trench 7U was configured to be 250 μm, and the second distance d2 of the second trench 7L was configured to be 250 μm. The wafer support structure was configured as a wafer having a circular planar shape having a diameter of 300 mm. In addition, the first and second strained layers 120c and 130c were configured to include a plurality of sub pattern layers 122c and 132c having the same size, respectively, and the sub pattern layers 122c and 132c were configured to have a first width W1 of 7.5 mm and a second width W2 of 7.5 mm on the upper and lower surfaces of the wafer support structure, respectively. In addition, the neighboring sub-pattern layers were configured to have a first interval S1 of 2.5 mm and a second interval S2 of 2.5 mm.

The polymer material applied to the first strained layer 120c or the second strained layer 130c was configured as an epoxy in which a filler of silica (SiO2) material was dispersed in a predetermined amount. At this time, according to the amount of the filler dispersed in the epoxy, the epoxy material was classified as Sample 1 through Sample 6 in Table 1. In addition, in Table 1, the Young's modulus of the epoxy of Samples 1 to 6 was shown together. The Young's modulus was measured at 25° C.

TABLE 1

| Epoxy Sample | Filler Amount (%) | Epoxy Young's modulus (MPa) |
| --- | --- | --- |
| Sample 1 | 83.5 ± 2 | 18,630 |
| Sample 2 | 89.8 ± 0.7 | 22,537 |
| Sample 3 | 87.8 ± 0.7 | 20,918 |
| Sample 4 | 88.4 ± 0.7 | 21,764 |
| Sample 5 | 83.2 ± 1.0 | 18,125 |
| Sample 6 | 88.5 ± 0.7 | 20,374 |

Example specimens 1 to 3 of Table 2 were prepared as wafer support structures for applying the samples 1 to 6 to the first strained layer 120c or the second strained layer 130c.

TABLE 2

|  | First Strained Layer | Second Strained Layer |
| --- | --- | --- |
| Example specimen 1 | Sample 1 | Sample 2 |
| Example specimen 2 | Sample 3 | Sample 4 |
| Example specimen 3 | Sample 5 | Sample 6 |

Along with the Example specimens 1 to 3, as the Comparative Example specimen, a wafer support structure consisting only of a support made of silicon having a thickness of 775 μm without the first and second strained layers was configured. The Comparative Example specimen, Example specimens 1 to 3 were attached to the same working wafer to form respective stack structures corresponding to the Comparative Example specimen, Example specimens 1 to 3, respectively. After the stack structures were heat treated for 1 hour at 150° C. and cooled to room temperature, the degree of warpage of each of the stack structures at room temperature was simulated. In the working wafers bonded to the Example specimens 1 to 3, respectively, the thermal expansion rate at the bonding surface with the first strained layer 120c was configured to be greater than the thermal expansion rate at the working surface.

The degree of warpage was derived as the maximum height from the reference plane when the stack structure was seated on a flat reference plane. That is, the lower the maximum height, the lower the degree of warpage.

Figure 8:
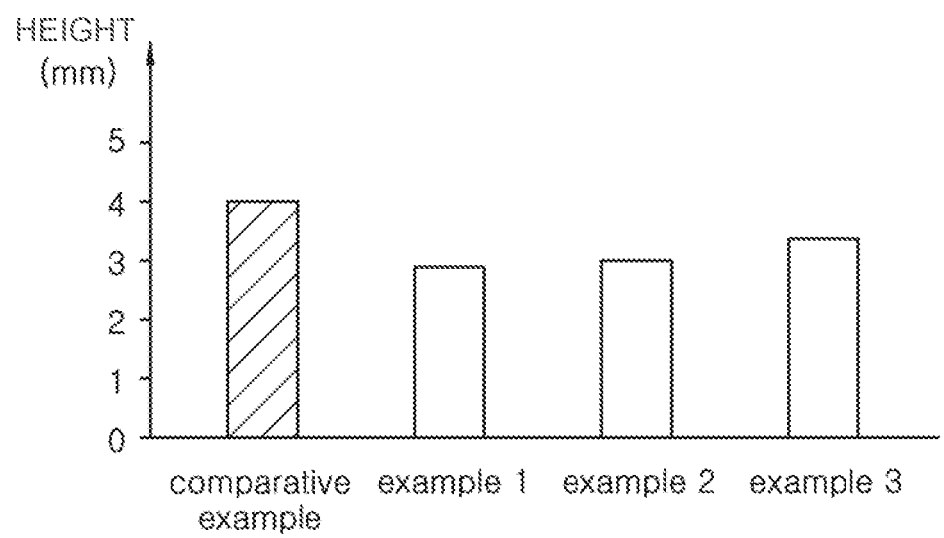
FIG. 8 is a graph illustrating a result of simulation for the degree of warpage of specimens of a comparative example and an example according to an embodiment of the present disclosure.

FIG. 8 is a graph illustrating a result of simulation of the warpage degree of specimens of a comparative example and examples according to an embodiment of the present disclosure. Hereinafter, for the convenience of description, a stack structure fabricated by bonding the Comparative Example specimen and a working wafer is referred to as a comparative example, and stack structures fabricated by bonding the Example specimens 1 to 3 and working wafers are referred to as examples 1 to 3, respectively.

Referring to FIG. 8, in the comparative example, a height of 4 mm was shown. For examples 1, 2 and 3, the heights were 2.9 mm, 3.0 mm, and 3.3 mm, respectively.

In comparison with the comparative example, it can be identified that the warpage of examples 1 to 3 is reduced. In addition, it can be seen that the greater the difference in filler amount between the first and second strained layers 120c and 130c, that is, the greater the difference in Young's modulus, the lower the warpage of the stack structure.

As described above, the embodiments of the concepts herein have been disclosed above for illustrative purposes. Those of ordinary skill in the art will appreciate that various modifications, additions and substitutions are possible, without departing from the scope and spirit of the concepts as disclosed in the accompanying claims.

What is claimed is:

1. A wafer supporting structure comprising:
a supporting body;
a first strained layer disposed on an upper portion of the supporting body and having a first thermal expansion rate; and
a second strained layer disposed on a lower portion of the supporting body and having a second thermal expansion rate different from the first thermal expansion rate,
wherein one of the first strained layer and the second strained layer is configured to receive a working wafer thereon, wherein the working wafer has a bonding surface in contact with the first strained layer or the second strained layer and a working surface opposite to the bonding surface, and wherein a thermal expansion rate of the working wafer on the bonding surface is greater than a thermal expansion rate of the working wafer on the working surface, and one of the first strained layer and the second strained layer, having a greater thermal expansion rate is bonded to the bonding surface.

2. The wafer supporting structure of claim 1, wherein the supporting body comprises a material having a stiffness greater than a stiffness of the first strained layer, and wherein the stiffness of the material of the supporting body is greater than a stiffness of the second strained layer.

3. The wafer supporting structure of claim 2, wherein the supporting body comprises anyone of silicon and silicon oxide.

4. The wafer supporting structure of claim 1, wherein the first strained layer comprises epoxy in which a silica filler of a first amount is dispersed, and wherein the second strained layer comprises epoxy in which a silica filler of a second amount different from the first amount is dispersed.

5. The wafer supporting structure of claim 1, wherein the first strained layer is bonded to an upper surface of the supporting body, the second strained layer is bonded to a lower surface of the supporting body, and the supporting body, the first strained layer and the second strained layer have substantially the same thickness.

6. The wafer supporting structure of claim 1, wherein the first and second strained layers are disposed to bury the supporting body.

7. The wafer supporting structure of claim 1, further comprising a first trench and a second trench formed in the upper portion and the lower portion of the supporting body, respectively, wherein the first strained layer is disposed to fill the first trench, and the second strained layer is disposed to fill the second trench.

8. The wafer supporting structure of claim 7, wherein an upper surface of the first strained layer is disposed on the same level as an upper surface of the supporting body, and a lower surface of the second strained layer is disposed on the same level as a lower surface of the supporting body.

9. The wafer supporting structure of claim 7, wherein the first strained layer comprises a plurality of sub pattern layers arranged in a predetermined direction while being spaced apart from each other in the supporting body, and wherein the second strained layer comprises a plurality of sub pattern layers arranged in a predetermined direction while being spaced apart from each other in the supporting body.

10. The wafer supporting structure of claim 9, wherein the plurality of sub pattern layers of the first strained layer are spaced apart from each other at a predetermined interval, and the plurality of sub pattern layers of the second strained layer are spaced apart from each other at a predetermined interval.

11. The wafer supporting structure of claim 9, wherein the plurality of sub pattern layers of the first strained layer have a first thickness corresponding to a distance inward from an upper surface of the supporting body, and the plurality of sub pattern layers of the second strained layer have a second thickness corresponding to a distance inward from a lower surface of the supporting body, and wherein the first thickness is substantially the same as the second thickness.

12. A wafer supporting structure comprising:

a supporting body;

a first strained layer disposed on an upper portion of the supporting body and having a first thermal expansion rate; and a second strained layer disposed on a lower portion of the supporting body and having a second thermal expansion rate different from the first thermal expansion rate, wherein one of the first strained layer and the second strained layer is configured to receive a working wafer thereon, wherein the working wafer has a bonding surface in contact with the first strained layer or the second strained layer and a working surface opposite to the bonding surface, and wherein a thermal expansion rate of the working wafer on the bonding surface is less than a thermal expansion rate of the working wafer on the working surface, and one of the first strained layer and the second strained layer, having a lower thermal expansion rate is bonded to the bonding surface.

13. A wafer supporting structure comprising:

a supporting body;

a first polymer layer disposed on an upper portion of the supporting body; and a second polymer layer disposed on a lower portion of the supporting body;

wherein the first polymer layer comprises an epoxy having a first amount of filler and the second polymer layer comprises an epoxy having a second amount of filler different from the first amount of filler, and wherein one of the first polymer layer and the second polymer layer is configured to receive a working wafer thereon.

14. The wafer supporting structure of claim 13, wherein the first polymer layer and the second polymer layer have different thermal expansion rates.

15. The wafer supporting structure of claim 14, wherein the supporting body comprises anyone of silicon and silicon oxide.

16. The wafer supporting structure of claim 13, wherein the working wafer has a bonding surface in contact with the first polymer layer or the second polymer layer and a working surface opposite to the bonding surface, and wherein a thermal expansion rate of the working wafer on the bonding surface is greater than a thermal expansion rate of the working wafer on the working surface, and one of the first polymer layer and the second polymer layer, having a greater thermal expansion rate is bonded to the bonding surface.

17. The wafer supporting structure of claim 13, wherein the working wafer has a bonding surface in contact with the first polymer layer or the second polymer layer and a working surface opposite to the bonding surface, and wherein a thermal expansion rate of the working wafer on the bonding surface is less than a thermal expansion rate of the working wafer on the working surface, and one of the first polymer layer and the second polymer layer, having a lower thermal expansion rate is bonded to the bonding surface.

18. The wafer supporting structure of claim 13, wherein the supporting body, the first polymer layer, and the second polymer layer have substantially the same thickness.

19. The wafer supporting structure of claim 13, wherein the first and second polymer layers bury the supporting body.

20. The wafer supporting structure of claim 13, further comprising a first trench and a second trench formed in the upper portion and the lower portion of the supporting body, respectively,
   wherein the first polymer layer is disposed to fill the first trench, and the second polymer layer is disposed to fill the second trench.

* * * * *